United States Patent
Zur et al.

(10) Patent No.: US 11,391,556 B2
(45) Date of Patent: Jul. 19, 2022

(54) METHOD AND APPARATUS FOR PHASE-BASED SYNCHRONIZATION IN MAGNETIC TRACKING SYSTEMS

(71) Applicant: PENUMBRA, INC., Alameda, CA (US)

(72) Inventors: Oded Y. Zur, Kochav-Yair (IL); Ron Barak, Tel Aviv (IL); Michael D. Collins, Santa Cruz, CA (US); Alejandro Santiago Diaz, Ross, CA (US); Ran Bar-On, Tel Aviv (IL); Cameron J. Mahon, Guelph (CA)

(73) Assignee: PENUMBRA, INC., Alameda, CA (US)

( * ) Notice: Subject to any disclaimer, the term of this patent is extended or adjusted under 35 U.S.C. 154(b) by 493 days.

(21) Appl. No.: 16/455,397

(22) Filed: Jun. 27, 2019

(65) Prior Publication Data

US 2020/0158487 A1 May 21, 2020

Related U.S. Application Data

(60) Provisional application No. 62/769,339, filed on Nov. 19, 2018.

(51) Int. Cl.
*G01B 7/004* (2006.01)

(52) U.S. Cl.
CPC .................. *G01B 7/004* (2013.01)

(58) Field of Classification Search
CPC ............. G01B 7/004; G01R 33/0023; G01R 33/0206; G01R 33/028; G06F 3/011; G06F 3/0346
See application file for complete search history.

(56) References Cited

U.S. PATENT DOCUMENTS

| | | |
|---|---|---|
| 4,737,794 A | 4/1988 | Jones |
| 7,873,491 B2 | 1/2011 | Higgins |
| 8,013,595 B2 | 9/2011 | Jones |
| 8,121,812 B2 | 2/2012 | Higgins |

(Continued)

OTHER PUBLICATIONS

"Three-phase wireless power transfer for electric vehicle charging with improved receiver misalignment tolerance"; Master's Thesis by Shuang Nie (Year: 2020).*

*Primary Examiner* — Roy Y Yi
*Assistant Examiner* — Geoffrey T Evans
(74) *Attorney, Agent, or Firm* — Haley Guiliano LLP (57) ABSTRACT

A system and method for performing synchronization of a magnetic field transmitter and receiver to resolve received signal phase ambiguity based upon the phases of the magnetic fields. Three orthogonal field frequencies are selected. A Fourier transform extracts the sine and cosine of the received signal, which provides the received signal phases and results in a complex signal matrix ("Sigmat"). A search is made for a phase rotation of the frequencies to achieve convergence of the Sigmat at a point it is real-valued; the search may be limited by aligning the Sigmat such that the major element becomes real-valued and rotating the other two frequencies. The correct phase is the one in which the Sigmat has a positive determinant and minimizes any remaining imaginary portion. A transmitter and receiver may be calibrated to account for any analog phase shift. Distortion of the magnetic field may also be detected and corrected.

16 Claims, 3 Drawing Sheets

(56) References Cited

U.S. PATENT DOCUMENTS

| | | | |
|---|---|---|---|
| 10,234,306 B2 | 3/2019 | Pedrotti | |
| 2005/0285590 A1* | 12/2005 | Higgins | G01B 7/004 |
| | | | 324/207.17 |
| 2016/0011013 A1* | 1/2016 | Pedrotti | G01C 25/00 |
| | | | 702/89 |
| 2019/0353745 A1* | 11/2019 | Zur | G01S 5/021 |

* cited by examiner

METHOD AND APPARATUS FOR PHASE-BASED SYNCHRONIZATION IN MAGNETIC TRACKING SYSTEMS

This application claims priority to Provisional Application No. 62/769,339, filed Nov. 19, 2018, which is incorporated by reference herein in its entirety.

FIELD OF INVENTION

The present invention relates generally to magnetic tracking systems, and more particularly to the synchronization of transmitters and receivers in magnetic tracking systems.

BACKGROUND OF THE INVENTION

AC electromagnetic trackers, and the processors that determine the position and orientation of such trackers, are well known to those of skill in the art. One such example, U.S. Pat. No. 4,737,794 ("the '794 patent"), teaches a "method and apparatus for determining remote object orientation and position with an electromagnetic coupling." It shows a transmitter comprising a plurality of radiating antennas, located at a source to provide a plurality of magnetic fields spanning three dimensional space and defining a source reference coordinate frame, and a receiver comprising a plurality of receiving antennas located on an object to be tracked for receiving that field. A processor receives the outputs from the receiving antennas and converts the received components of the transmitted magnetic fields into remote object position and orientation relative to the source reference coordinate frame. The antennas may be, for example, dipole antennas, loop antennas, or coil antennas.

In practice, the transmitter typically includes three radiating antennas, often situated on orthogonal axes, that are frequency division multiplexed (FDM) at three orthogonal frequencies; a set of three frequencies is considered a frequency band. (Antennas that are time division multiplexed (TDM) at three time slots have also been used.) The receiver also typically includes three receiving antennas. In "wired" magnetic tracking systems, the receiver and transmitter can communicate over a hard, i.e., physical, connection, typically a wire. In wireless magnetic tracking systems, communication is over a wireless communication protocol and there is no hard connection. As those skilled in the art will understand, each magnetic field signal is a sine wave.

One common application is tracking a user for the purpose of playing a video game or being immersed in a virtual reality world. In some prior art embodiments, a transmitter may be located in a fixed position, such as in a local base station, video game console or other apparatus. A receiver in a tracking device provides information about the sensed magnetic fields to a processor, which derives the position and orientation of the tracking device relative to the base station from such information.

There are a number of factors that can cause error in the detection of the magnetic field by a receiver, and thus cause the position and orientation of the receiver to be incorrectly determined. For example, objects located between the transmitter and receiver may cause distortion of the magnetic field, particularly if the objects contain ferrous materials. Conducting surfaces in the environment may contain eddy currents induced by the magnetic field that in turn generate secondary magnetic fields that interfere with the ability of the receiver to properly determine the source magnetic field. Such errors often increase as the distance between the transmitter and receiver increases, and may not be linear.

One particular source of ambiguity that is unique to wireless magnetic tracking systems is the magnetic field signal phases that are received by the sensor. In wired magnetic tracking systems, a synchronization (or "sync") signal is typically sent between the transmitter and receiver and indicates the phases of the magnetic field signals and enables the receiver to extract the relative signs of the signals, i.e., distinguish between a "positive" sine wave and a "negative" sine wave. The signs indicate the orientation and direction of the magnetic field (i.e. positive or negative in direction and its orientation).

In a wireless system, when there is no sync signal between the receiver and transmitter, there is an ambiguity with respect to the signal's signs and thus also with respect to the position and orientation of the receiver relative to the transmitter. (This may also be true in a wired system if the sync signal fails or is not present or used, either by design or otherwise.) When the phase of the transmitted signal is unknown, the sign of the received signals is ambiguous, which can create an additional uncertainty in transmitter.

Prior art attempts to eliminate phase ambiguity in wireless systems have used certain techniques or additional hardware to do so. For example, U.S. Pat. No. 10,234,306, incorporated by reference herein in its entirety, describes various methods of determining synchronization using a component such as an inertial measurement unit (IMU) that may contain devices such as accelerometers, gyroscopes and magnetometers. In some embodiments a means other than a wire may be used to pass a sync signal containing phase information, for example, a radio frequency or optical link; these again require additional hardware.

Other prior art embodiments require the system to be initialized by the user placing the receiver in a known position and orientation relative to the transmitter, and then generating a signal, for example, by pressing a button, to indicate that the system is in a correct state to establish synchronization before starting to use the system. This enables the system to identify the correct signal phases initially, and then track the phases during use. However, this initialization needs to be done every time the system is turned on before usage.

It is desirable to be able to create a magnetic tracking system that can perform synchronization without additional hardware, and without repeated initialization by the user.

SUMMARY OF THE INVENTION

A system and method is disclosed for performing synchronization of a magnetic field transmitter and receiver to resolve ambiguity based upon the phases of the magnetic field signals.

One embodiment discloses a system for synchronizing a transmitter and a receiver in a magnetic tracking system, comprising: the transmitter having a plurality of source magnetic coils configured to generate a magnetic field at orthogonal frequencies that converge over a sampling window, each frequency provided by a direct digital synthesis (DDS) component; the receiver having a plurality of sensor magnetic coils configured to sense the magnetic field and generate magnetic sensor data; and a processor configured to: perform a complex discrete Fourier transform on the magnetic sensor data from the sensor magnetic coils to determine a complex signal matrix (Sigmat) representing the phase of the sensed magnetic field frequencies; rotate the complex Sigmat by rotating the phases of the sensed magnetic field frequencies to seek convergence of the complex Sigmat at a nearly real value; compute as an error for each rotation a norm of any remaining imaginary portion of the rotated Sigmat; multiply the rotated Sigmat by −1 when the real-valued determinant of the rotated Sigmat with the smallest computed error is negative; compute a confidence value by dividing a second smallest computed error by the smallest computed error; determine that the confidence value is over a predetermined threshold; and use the real part of the rotated Sigmat with the smallest computed error to synchronize the receiver with the transmitter.

Another embodiment discloses a method of synchronizing a transmitter and a receiver in a magnetic tracking system, comprising: generating a magnetic field from a plurality of source magnetic coils in the transmitter, the source coils configured to generate a magnetic field at orthogonal frequencies that converge over a sampling window, each frequency provided by a direct digital synthesis (DDS) component; generating magnetic sensor data by sensing the magnetic field using a plurality of sensor magnetic coils in the receiver; performing by a processor a complex discrete Fourier transform on the magnetic sensor data from the sensor magnetic coils to determine a complex signal matrix (Sigmat) representing the phase of the sensed magnetic field frequencies; rotating by the processor the complex Sigmat by rotating the phases of the sensed magnetic field frequencies to seek convergence of the complex Sigmat at a nearly real value; computing by the processor as an error for each rotation a norm of any remaining imaginary portion of the rotated Sigmat; multiplying by the processor the rotated Sigmat by −1 when the real-valued determinant of the rotated Sigmat with the smallest computed error is negative; computing by the processor a confidence value by dividing a second smallest computed error by the smallest computed error; determining by the processor that the confidence value is over a predetermined threshold; and using by the processor the real part of the rotated Sigmat with the smallest computed error to synchronize the receiver with the transmitter.

Still another embodiment discloses a non-transitory computer readable storage medium having embodied thereon instructions for causing a computing device to execute a method for synchronizing a transmitter and a receiver in a magnetic tracking system, the method comprising: generating a magnetic field from a plurality of source magnetic coils in the transmitter, the source coils configured to generate a magnetic field at orthogonal frequencies that converge over a sampling window, each frequency provided by a direct digital synthesis (DDS) component; generating magnetic sensor data by sensing the magnetic field using a plurality of sensor magnetic coils in the receiver; performing by a processor a complex discrete Fourier transform on the magnetic sensor data from the sensor magnetic coils to determine a complex signal matrix (Sigmat) representing the phase of the sensed magnetic field frequencies; rotating by the processor the complex Sigmat by rotating the phases of the sensed magnetic field frequencies to seek convergence of the complex Sigmat at a nearly real value; computing by the processor as an error for each rotation a norm of any remaining imaginary portion of the rotated Sigmat; multiplying by the processor the rotated Sigmat by −1 when the real-valued determinant of the rotated Sigmat with the smallest computed error is negative; computing by the processor a confidence value by dividing a second smallest computed error by the smallest computed error; determining by the processor that the confidence value is over a predetermined threshold; and using by the processor the real part of the rotated Sigmat with the smallest computed error to synchronize the receiver with the transmitter.

Another embodiment discloses a system for synchronizing a transmitter and a receiver in a magnetic tracking system, comprising: the transmitter having a plurality of source magnetic coils configured to generate a magnetic field at orthogonal frequencies that converge over a sampling window, each frequency provided by a direct digital synthesis (DDS) component; the receiver having a plurality of sensor magnetic coils configured to sense the magnetic field and generate magnetic sensor data; and a processor configured to: perform a complex discrete Fourier transform on the magnetic sensor data from the sensor magnetic coils to determine a complex signal matrix (Sigmat) representing the phase of the sensed magnetic field frequencies; change values of a middle column of the complex Sigmat to zero, creating a first modified Sigmat; rotate the modified Sigmat by rotating the phases of the sensed magnetic field frequencies to seek convergence of the modified Sigmat at a nearly real value, thereby obtaining a first phase adjustment; rotate the modified Sigmat by the first phase adjustment and restore the values of the middle column, creating a second modified Sigmat; rotate the second modified Sigmat by a second phase adjustment within a range determined from values of first and third columns of the rotated Sigmat; compute as an error for each rotation of the second modified Sigmat a norm of any remaining imaginary portion of the second modified Sigmat; multiply the second modified Sigmat by −1 when the real-valued determinant of the rotated second modified Sigmat with the smallest computed error is negative; compute a confidence value by dividing a second smallest computed error by the smallest computed error; determine that the confidence value is over a predetermined threshold; and use the real part of the rotated second modified Sigmat with the smallest computed error to synchronize the receiver with the transmitter.

Yet another embodiment discloses a method of synchronizing a transmitter and a receiver in a magnetic tracking system, comprising: generating a magnetic field from a plurality of source magnetic coils in the transmitter, the source coils configured to generate a magnetic field at orthogonal frequencies that converge over a sampling window, each frequency provided by a direct digital synthesis (DDS) component; generating magnetic sensor data by sensing the magnetic field using a plurality of sensor magnetic coils in the receiver; performing by a processor a complex discrete Fourier transform on the magnetic sensor data from the sensor magnetic coils to determine a complex signal matrix (Sigmat) representing the phase of the sensed magnetic field frequencies; changing by the processor values of a middle column of the complex Sigmat to zero, creating a first modified Sigmat; rotating by the processor the modified Sigmat by rotating the phases of the sensed magnetic field frequencies to seek convergence of the modified Sigmat at a nearly real value, thereby obtaining a first phase adjustment; rotating by the processor the modified Sigmat by the first phase adjustment and restore the values of the middle column, creating a second modified Sigmat; rotating by the processor the second modified Sigmat by a second phase adjustment within a range determined from values of first and third columns of the rotated Sigmat; computing by the processor as an error for each rotation of the second modified Sigmat a norm of any remaining imaginary portion of the second modified Sigmat; multiplying by the processor the second modified Sigmat by −1 when the real-valued determinant of the rotated second modified Sigmat with the smallest computed error is negative; computing by the processor a confidence value by dividing a second smallest computed error by the smallest computed error; determining by the processor that the confidence value is over a predetermined threshold; and using by the processor the real part of the rotated second modified Sigmat with the smallest computed error to synchronize the receiver with the transmitter.

Still another embodiment discloses a non-transitory computer readable storage medium having embodied thereon instructions for causing a computing device to execute a method for synchronizing a transmitter and a receiver in a magnetic tracking system, the method comprising: generating a magnetic field from a plurality of source magnetic coils in the transmitter, the source coils configured to generate a magnetic field at orthogonal frequencies that converge over a sampling window, each frequency provided by a direct digital synthesis (DDS) component; generating magnetic sensor data by sensing the magnetic field using a plurality of sensor magnetic coils in the receiver; performing by a processor a complex discrete Fourier transform on the magnetic sensor data from the sensor magnetic coils to determine a complex signal matrix (Sigmat) representing the phase of the sensed magnetic field frequencies; changing by the processor values of a middle column of the complex Sigmat to zero, creating a first modified Sigmat; rotating by the processor the modified Sigmat by rotating the phases of the sensed magnetic field frequencies to seek convergence of the modified Sigmat at a nearly real value, thereby obtaining a first phase adjustment; rotating by the processor the modified Sigmat by the first phase adjustment and restore the values of the middle column, creating a second modified Sigmat; rotating by the processor the second modified Sigmat by a second phase adjustment within a range determined from values of first and third columns of the rotated Sigmat; computing by the processor as an error for each rotation of the second modified Sigmat a norm of any remaining imaginary portion of the second modified Sigmat; multiplying by the processor the second modified Sigmat by −1 when the real-valued determinant of the rotated second modified Sigmat with the smallest computed error is negative; computing by the processor a confidence value by dividing a second smallest computed error by the smallest computed error; determining by the processor that the confidence value is over a predetermined threshold; and using by the processor the real part of the rotated second modified Sigmat with the smallest computed error to synchronize the receiver with the transmitter.

DETAILED DESCRIPTION OF THE INVENTION

In one embodiment, a method and apparatus is disclosed for synchronizing a magnetic field transmitter and receiver to resolve ambiguity based upon the phases of the magnetic field signals so that the correct position and orientation of the receiver may be derived and maintained, without the use of additional hardware, such as an IMU, or a required user action, such as placing the receiver in a known location and pressing a button. The phase information may then be tracked and updated, assuming that there is correlation between the signals from the receiver from one measurement to the next.

To achieve this without user intervention requires first, a specific and precise relationship between the three magnetic field frequencies generated by the transmitter and received by the receiver as described herein, and second, known and stable phase behavior of the transmitter and electronic circuitry. To satisfy the first requirement, the transmitter should transmit perfectly aligned, non-drifting signals in all three frequencies. All three frequencies should converge back to zero at the start and end of each sampling window (about $1/240$ second herein as below) without drifting over time.

The second requirement may be accomplished by a phase calibration step as described below, performed once during production of the magnetic tracking system and that can account for the tolerances in phase shift from the specific components used to build the magnetic tracking system. Alternatively, the system may be designed to perform its own calibration the first time it is powered on, before usage.

As explained further below, the transmitter and receiver circuitry are calibrated to measure any phase shifts therein. The three transmitted magnetic field frequencies are selected so that their phases converge periodically within a sampling window. A complex discrete Fourier transform (DFT) extracts the sine and cosine of the received signal, which provides the amplitude and phase of the received signal and results in a complex 3×3 signal matrix (called "Sigmat" herein). A search is then made for a phase rotation of the three frequencies to achieve convergence of the Sigmat at a point when the Sigmat is entirely or nearly real valued, i.e., has little or no imaginary component; the search may be limited by aligning the Sigmat such that the major frequency element becomes real valued and rotating the other two frequencies while maintaining the major frequency. The correct phase is the one that meets the rule of a "right hand" system, i.e., the Sigmat has a positive determinant and minimizes the norm, or absolute value, of any remaining imaginary portion of the rotated signal.

In essence, the phase rotation "rewinds" the sine waves back in time to determine a point in time at which the sine waves of the three frequencies converged at the same value (typically zero) as at the initial starting point.

Figure 1:
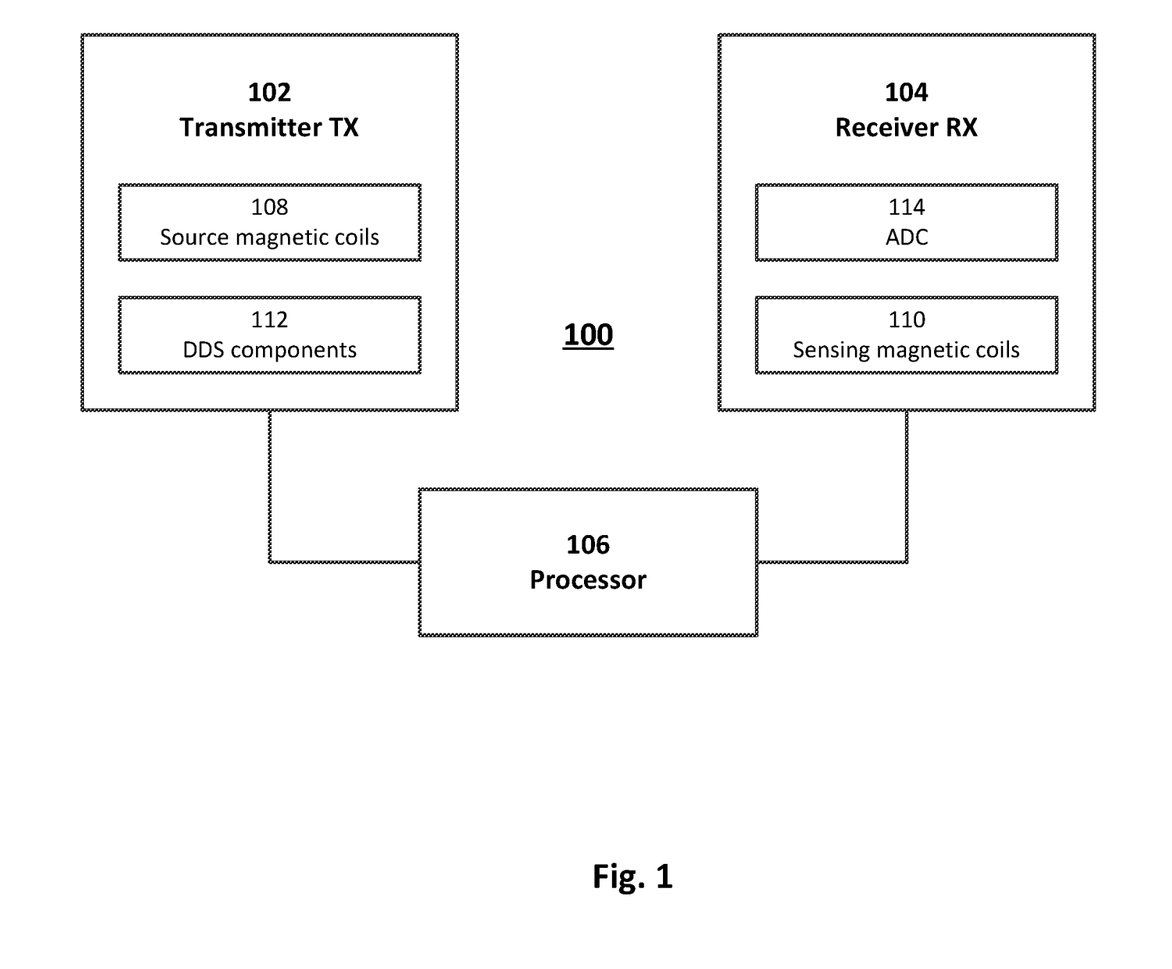
FIG. 1 is a block diagram of a magnetic tracking system according to one embodiment.

FIG. 1 is a block diagram of a system for a magnetic tracking system according to one embodiment. System 100 contains a transmitter TX 102, a receiver RX 104 and a processor 106. As above, transmitter 102 is often located in a base station, while receiver 104 is attached to some movable object or person. Also as above, transmitter 102 contains source magnetic coils 108 for generating magnetic fields, while receiver 104 contains sensing magnetic coils 110 for sensing the magnetic fields.

System 100 also contains processor 106, which generates a Sigmat and performs synchronization as described herein from the data it receives from transmitter 102 and receiver 104, and then generates a position and orientation of the receiver. The processor also provides instructions to three direct digital synthesis (DDS) components 112 that generate the three magnetic field frequencies. An analog-to-digital converter (ADC) 114 in the receiver 104 converts information about the received frequencies to digital signals for processing as described herein.

System 100 may be either a wired system or a wireless system. As above, in a wired system a sync signal is typically sent between the transmitter and receiver that indicates the phases of the magnetic field signals. Thus, it is expected that the method described herein will be used primarily in wireless systems in which there is no sync signal. However, the described method may be used in wired systems if desired, if for some reason a sync signal is not provided or used, or as a backup in case of failure of a provided sync signal.

In such an electromagnetic tracking system the three magnetic fields are sensed and separated to generate a complex-valued 3×3 a total of nine measures of the three transmitted magnetic fields; each column corresponds to the sensed field from a separate one of the three coils of the transmitter, and each row corresponds to a separate one of the three coils of the receiver. One example of a 3×3 matrix that might represent Sigmat is:

| a11 | a12 | a13 |
| a21 | a22 | a23 |
| a31 | a32 | a33 | where a11 rough a33 represent the nine measures of the three magnetic fields, one complex measure (amplitude and phase) of each magnetic field by each of the three receiver coils. It is the evaluation of Sigmat that results in a determination of the position and orientation of the receiver.

As described herein, applying phase information allows for determination of a real-valued Sigmat. Since each receiver coil sees the same phase for a certain transmitted frequency, the relative signs between the complex-valued components of each Sigmat column are determined (each Sigmat column represents a single transmitted frequency, measured by 3 different receiver coils); it then remains to determine the overall sign of each of the 3 Sigmat columns, which can be considered as different phase combinations. There are eight ($2^3$) possible phase combinations, and thus eight possible values of SigMat; however, only four of the possible values of SigMat have a positive determinant. Thus, the problem of solving for the correct sync is reduced to choosing from those four possibilities.

If the transmitter and receiver are synchronized so that the phase of the magnetic field is known, and the system is phase-calibrated, determining a Sigmat from a particular position and orientation of the receiver is straightforward using the formula for the electromagnetic fields. A transmitter "TX" generates, in good approximation, three simple dipole fields. One of skill in the art will appreciate phase of each of the three frequencies would start at zero and the transmitter and receiver would be in synchronization; as above, in a wired system, a synchronization signal can cause this to occur. However, in practice in a wireless magnetic tracking system this generally does not occur, and the three frequencies each begin at a different phase in their respective sine waves when the receiver begins to sense the magnetic field.

Certain applications using wireless magnetic tracking systems require that the position and orientation of the receiver be updated often enough (the "refresh rate") that movement of the receiver appears continuous to the user. The desired refresh rate may vary with the intended application. For example, in applications such as video games, in which the receiver is typically a game controller controlling the position of a cursor on a screen or an object in a virtual reality, a relatively high speed refresh rate of 120 Hertz, i.e., updated position 120 times per second, is desirable. In other, slower applications, a lower refresh rate of 30 Hz or more may be acceptable. To accomplish a given refresh rate, the position and orientation of the receiver is determined at the end of a sampling window, during which the magnetic field is sensed and the position and orientation of the receiver determined, which is the inverse of the refresh rate. Thus, for a 120 Hz refresh rate, the sampling window is generally $\frac{1}{120}$ of a second, while for a 30 Hz refresh rate the sampling window is $\frac{1}{30}$ of a second.

In one embodiment, a wireless magnetic tracking system may use a sampling window of $\frac{1}{240}$ of a second, updating the position and orientation of the receiver after each sampling window, i.e., 240 times a second, resulting in a 240 Hz refresh rate, with 800 samples taken in each window. Regardless of the refresh rate, the three magnetic field frequencies should be orthogonal within the sampling window, i.e., each frequency should be an integer multiple of the refresh rate, in this case 240. It will be apparent that all three magnetic field sine wave signals will simultaneously cross zero multiple times during each sampling window, although this does not mean that any of the 800 samples will happen to be taken at exactly one of those times.

As above, the three magnetic field frequencies are generated by three direct digital synthesis (DDS) components controlled by the processor. One such DDS component is the AD9838 from Analog Devices; any other component that can generate the required frequencies can be used. The AD9838 receives a clock signal, and has a register for setting values M so as to generate each of the desired output frequencies $f_{out}$ according to:

$$f_{out} = \frac{M \cdot f_c}{2^{28}} \quad \text{(Equation 1)}$$

where $f_c$ is the clock frequency, 12,288,000 Hz herein. All three DDS components are fed by the same clock and output their frequencies digitally, so there is no analog drift in the DDS components. Again, the three frequencies in a band are always an integer multiple of the rate of the sampling window, in this case 240, so that all three frequencies will always be orthogonal in the window.

When a DFT is performed on the samples of the received magnetic field in a sampling window, a 3×3 complex Sigmat, i.e., a Sigmat with phases, is obtained, designated herein as $Z_{mn}$. Instead of searching for one of the points at which all three sine wave signals cross zero in the sampling window, the phases of the complex Sigmat are analyzed, which is a much more robust approach and one less prone to noise and distortion. An attempt is made to find a value of the time φ that will satisfy the "synchronization equation":

$$Im\{Z_{mn} \cdot \exp(iw_n \varphi)\} = 0, \forall m, n \quad \text{(Equation 2)}$$

where:
Im is the imaginary part of the complex number $Z_{mn} \cdot \exp(iw_n \varphi)$, $w_n = 2\pi f_n$, and $f_n$ is the transmitted frequency, where n=1, 2, 3.

Those of skill in the art will appreciate that:

$$\exp(iw_n \varphi) = \cos w_n \varphi + i \sin w_n \varphi$$

and thus $\exp(iw_n \varphi)$ represents a rotation, i.e., a phase shift in $f_n$. (A phase shift of a Sigmat involves multiplying each column by $\exp(iw_n \varphi)$, which reflects a phase shift of the whole complex Sigmat by φ) Over time a sine or cosine wave defines a circle in a plane in which one axis is the real part of the value of exp and the other axis is the imaginary (the "i") part of the value of exp.

Thus, looking for a value of φ such that Equation 2 is zero means that a search is made for the time at which the Sigmat is entirely real valued, and there is no imaginary component. In theory, there could be multiple solutions for the synchronization Equation 2, but with carefully chosen frequencies only a single solution exists. In practice, rather than attempting to determine this theoretical perfect solution, equation 2 is solved in a least-squares manner to bring the imaginary values to a global minimum, as explained below.

The following table, Table 1, shows four frequency bands that have been implemented in a specific tracking system; each band is orthogonal with respect to a sampling window of $\frac{1}{240}$ of a second:

TABLE 1

| Band | $f_1$<br>Coil X<br>Frequency | $f_2$<br>Coil Y<br>Frequency | $f_3$<br>Coil Z<br>Frequency |
|---|---|---|---|
| A | 24000 | 25920 | 27840 |
| B | 24480 | 26400 | 28320 |
| C | 24960 | 26880 (+240) | 28800 |
| D | 25440 | 27360 | 29280 |

Having a unique phase-based synchronization solution depends on the greatest common denominator (gcd) of a band's frequencies. Setting φ=1/(2gcd), the following "sign vector" must reflect an impossible sign flip, i.e., a negative determinant:

$$[\exp(iw_1\varphi), \exp(iw_2\varphi), \exp(iw_3\varphi)] \quad \text{(Equation 3)}$$

where:
$w_n=2\pi f_n$, and n is 1, 2, or 3 for the three TX coils respectively, and φ is again the time being sought.

It will be seen that for bands A, B and D above, the sign vector of Equation 3 is equal to [−1 −1 −1] and thus reflects a negative determinant, i.e., an impossible sign flip. However, for the original frequencies of band C the sign vector is equal to [−1 1 −1], which corresponds to a positive determinant; this means that for band C there is an ambiguous synchronization solution in which the first and third values are flipped. To overcome this, an offset of 240 Hz is added to the original chosen frequency of 26880 Hz, so that the second frequency of band C is now 27120 Hz. The new sign vector is now [−1 −1 −1], which now also corresponds to a negative determinant and thus an impossible sign flip. The synchronization algorithm dismisses solutions with a negative determinant and so is not confused by this ambiguity. This modification makes band C usable by the synchronization algorithm at the small cost of the 240 Hz offset to the middle frequency and additional processing as described below.

Solving for φ in the synchronization Equation 2 is not a trivial task. There are three equations, representing the three frequencies, which need to be solved simultaneously but together represent a system of modulo equations that cannot be easily solved by formulation. While φ can be searched over the sampling window by brute force, this requires extensive computation time, especially if it is desired to provide full synchronization solutions at a high rate.

Instead, a more limited approach is utilized in which φ is searched among a greatly reduced subset of possible phases. First, the complex Sigmat $Z_{mn}$ is phase-shifted so that its greatest (or major) element is made real, and then iterations are made over phase shifts that do not change the major element.

This is accomplished by using phase shifts of the form:

$$\varphi_k = \frac{k}{f_0} \quad \text{(Equation 4)}$$

where $f_0$ corresponds to the frequency of the major element. This leaves the major element intact while rotating the other two columns of the complex Sigmat. Since it turns out that k is less than $f_0$/gcd, after which the signals repeat periodically, using this method will allow φ to be found by scanning a relatively small number of candidates, generally significantly less than 100, rather than having to search the entire sampling window. This enables the synchronization to run in real time with a full data rate without consuming an inordinate amount of computation resources.

While a phase shift representing the solution to the synchronization Equation 2 that makes the entire complex Sigmat real-valued is desirable, in practice no such exact phase shift will be found, and thus a phase shift that makes the complex Sigmat as close to real-valued as possible will be the best one found. In one embodiment, this may be determined by assigning each rotation an error value, which is the norm, or absolute value, of the remaining imaginary part of the rotated Sigmat. The phase shift that minimizes the error should correspond to an almost entirely real valued Sigmat. If the real-valued determinant of the best Sigmat is negative, the Sigmat is multiplied by −1 to make it positive.

To verify that the Sigmat with the best error value is the true sync-corrected Sigmat, in one embodiment a confidence value is determined by comparing the best error value to the second best error value. The second best error value is divided by the best error value, and the result is compared to a predetermined threshold. For example, if the threshold is a confidence value of 2, the second best error value would have to be twice as great as the best error value for the threshold to be met.

If the confidence value is greater than the threshold, the real portion of the best Sigmat is taken to be the true sync-corrected Sigmat, and used to determine the signs of the field amplitudes and to sync the transmitter and receiver. In some embodiments, additional filtering may be used, choosing to sync only when some number, for example, 20, consecutive confidence values above the threshold have been received for the same sync result.

Figure 2:
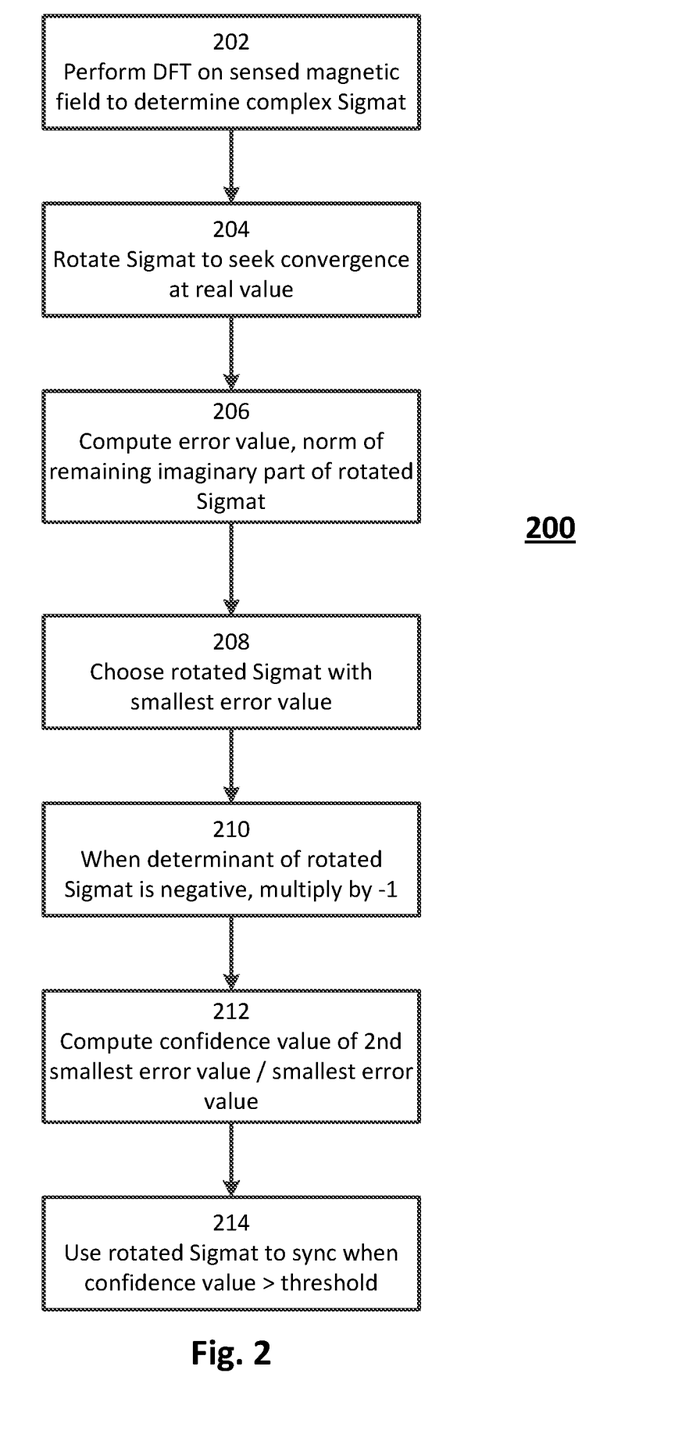
FIG. 2 is a flowchart of a process for performing phase-based synchronization of the transmitter and receiver in a magnetic tracking system according to one embodiment.

FIG. 2 is a flowchart of a process for synchronizing the transmitter and receiver in a wireless magnetic tracking system according to one embodiment. This embodiment assumes that the sign vector of Equation 3 for the frequency band in question reflects a negative determinant, such as that for frequency bands A, B and D of Table 1. At step 202, a processor, such as processor 106 in FIG. 1, performs a complex discrete Fourier transform on a complex Sigmat representing the phase of the sensed magnetic field frequencies. The complex Sigmat is determined from the magnetic field as sensed by the sensing coils in the receiver, such as sensing coils 110 in receiver 104 in FIG. 1, and may be determined by the same processor or a different processor.

At step 204, the processor rotates the complex Sigmat by rotating the phases of the senses magnetic frequencies, seeking a convergence of the complex Sigmat at a real, or nearly real, value.

At step 206, the processor determines for each rotation an error value, which is the norm, or absolute value, of any remaining imaginary portion of the rotated Sigmat.

At step 208, the processor chooses the rotated Sigmat with the smallest error value, and at step 210, when the determinant of the rotated Sigmat is negative, multiplies the rotated Sigmat by −1.

As a check that the rotated Sigmat with the smallest error is the true sync-corrected Sigmat, at step 212 the processor computes a confidence value by dividing the second smallest error value by the smallest error value. When the confidence value is over a predetermined threshold, at step 214, the rotated Sigmat with the smallest error value is taken to be the true sync-corrected Sigmat, and the processor uses the real portion of that sync-corrected Sigmat to determine the signs of the field amplitudes and to synchronize the transmitter and the receiver.

The process above is used when the greatest common denominator (gcd) of each pair of two of the three frequencies is the same. It will be seen that this is true for bands A, B and D of Table 1; that is, for each of those bands the gcd of frequencies X and Y is the same as the gcd of frequencies X and Z and the gcd of frequencies Y and Z. However, when the sign vector (Equation 3) of the frequency band selected does not reflect a negative determinant and an offset must be added to one of the frequencies which causes one of the pairs of frequencies to have a different gcd than the other two pair of frequencies, such as band C of Table 1 (the gcd of frequencies X and Z is different than the other frequency pairs), a slightly different procedure is needed to allow the band to be used.

Suppose that an offset is added to the middle frequency such as in the case of band C. In this case, the middle column of the complex Sigmat, which corresponds to the adjusted frequency (the coil Y frequency of band C of Table 1, which after adjustment becomes 27120 Hz), is set to zero, and a rotation performed on the modified complex Sigmat seeking convergence at a real value. This results in a solution for a phase adjustment, and the modified complex Sigmat is rotated by this phase, resulting in the first and third columns of the modified complex Sigmat being nearly real valued, but leaving the middle column with an arbitrary phase.

The complex Sigmat is then rotated by:

$$\varphi_k = \frac{k}{2gcd13} \quad \text{(Equation 5)}$$

$$\text{for } k \leq \frac{gcd13}{gcd12}$$

where gcd12 and gcd13 are the greatest common denominators of the first and second columns and the first and third columns, respectively, of the complex Sigmat.

This leaves the first and third columns, which are already nearly real valued, intact while rotating the middle column until it becomes real valued or nearly so. As in process 200 of FIG. 2, an error value of each rotation is computed and the complex Sigmat with the lowest error value for rotation of the middle column is chosen; if the determinant of that complex Sigmat is negative, the middle column is multiplied by −1. A confidence value may be computed as the ratio of the second smallest error value to the smallest error value as above, and if the confidence value exceeds a predetermined threshold, the rotated Sigmat with the smallest error value is used to synchronize the transmitter and receiver.

Figure 3:
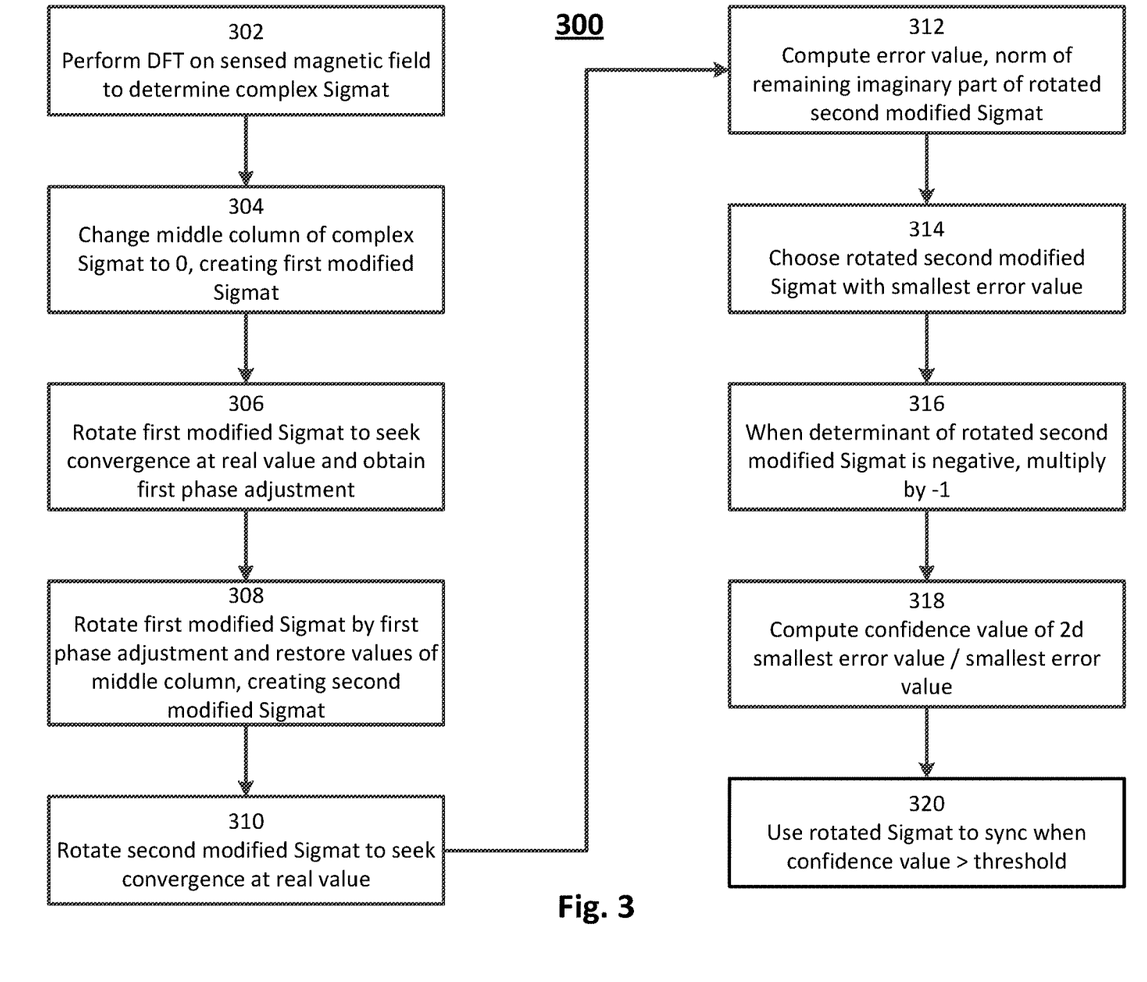
FIG. 3 is a flowchart of a process for performing phase-based synchronization of the transmitter and receiver in a magnetic tracking system according to another embodiment.

FIG. 3 is a flowchart of a process for synchronizing the transmitter and receiver in a wireless magnetic tracking system according to another embodiment, using a band that must be adjusted to have a negative determinant, such as band C of Table 1. At step 302, a processor, such as processor 106 in FIG. 1, performs a complex discrete Fourier transform on a complex Sigmat representing the phase of the sensed magnetic field frequencies. The complex Sigmat is determined from the magnetic field as sensed by the sensing coils in the receiver, such as sensing coils 110 in receiver 104 in FIG. 1, and may be determined by the same processor or a different processor.

At step 304, the processor sets the middle column of the complex Sigmat to zero, creating a first modified Sigmat. At step 306 the processor rotates the first modified Sigmat to seek convergence at a real value. As above, this results in a first phase adjustment at which the first and third columns of the modified Sigmat are nearly real valued.

At step 308 the processor rotates the Sigmat as originally determined from the sensed magnetic fields by the first phase adjustment, resulting in a modified Sigmat in which the first and third columns are nearly real-valued.

At step 310, the processor rotates the second modified Sigmat to seek convergence at a real value in order to find the phase of the rotation that will also make the middle column of the Sigmat real-valued, while preserving the phase of the first and third columns, thus keeping them real-valued.

At step 312, the processor determines for each rotation of the second modified Sigmat an error value, which is the norm, or absolute value, of any remaining imaginary portion of the rotated Sigmat.

At step 314, the processor chooses the rotated Sigmat with the smallest error value, and at step 316, when the determinant of the rotated Sigmat is negative, multiplies the rotated Sigmat by −1.

As a check that the rotated Sigmat with the smallest error is the true sync-corrected Sigmat, at step 318 the processor computes a confidence value by dividing the second smallest error value by the smallest error value. When the confidence value is over a predetermined threshold, at step 320, the rotated Sigmat with the smallest error value is taken to be the true sync-corrected Sigmat, and the processor uses the real portion of that sync-corrected Sigmat to synchronize the transmitter and the receiver.

The discussion above assumes that it is possible to precisely generate the frequencies specified by Equation 1, such as those in Table 1. Consider, for example, the frequencies of band A of Table 1. The desired frequencies are:

$$f_{out} = [24000\ 25920\ 27840]\ \text{Hz}$$

respectively, which as above are orthogonal inside the sampling window.

However, when trying to set the DDS to output those frequencies, one encounters a problem in selecting a value of M to enter into the DDS register. Rewriting Equation 1 to find a desired value of M results in:

$$M = \frac{f_{out} \cdot 2^{28}}{f_c} \quad \text{(Equation 5)}$$

where $f_c$ is again the clock frequency, 12,288,000 Hz herein, and $f_{out}$ is a desired output frequency. Using the frequencies of band A to determine the values of M results in values of:

$$M = [524288,\ 566231.04,\ 608174.08]$$

The latter two of these are not integers.

Since M must be an integer in the DDS, the latter two values get rounded down to 566231 and 608174, respectively, which in turn results in output frequencies of (rounded slightly):

$$f_{out\ actual}=[24000\ 25919.999\ 27839.999]\ Hz$$

While these frequencies are very close to the desired ones, they are no longer perfectly orthogonal in the sampling window. Even worse, they are different enough that their phases will slowly drift apart over time and will take much longer than 1/240 of a second to converge. After even a few seconds, the frequencies will no longer be related in a sensible manner, and it is no longer possible to deduce the correct synchronization from the sampling window. Each frequency will thus be assumed to have its own independent sign, resulting in a total of eight possible synchronizations, with unknown independent signs for each column of the Sigmat, as above. While four of these will be dropped as having negative determinants, there are still four possible synchronizations which must now be resolved some other way, for example, by means of an IMU, or by other techniques which may require more descriptive magnetic fields.

If the frequencies can be bound together in some way so as to converge back to zero at intervals of approximately 1/240 of a second, then a single possible, i.e., positive determinant, solution can be determined as above. While as above it is not possible to generate exactly the desired frequencies, a compromise may be reached by altering the frequencies slightly so as to converge almost every 1/240 of a second, thus being only slightly non-orthogonal in the original T=1/240 of a second sampling window, but orthogonal relative to a slightly different T.

With the clock frequency $f_c$ again 12,288,000 Hz, the sampling window T 1/240 of a second, M the DDS register value to set an output frequency font, this is accomplished by determining an altered output frequency $f_{out}'$ by:

$$T = \frac{1}{240}[s] \qquad \text{(Equation 6)}$$

$$f_T = \frac{1}{T} = 240[hz]$$

$$M_T = \left[\frac{f_T \cdot 2^{28}}{f_c}\right] = 5243$$

$$M = \left[\frac{f_{out} \cdot 2^{28}}{M_T \cdot f_c}\right] = 5243$$

$$M = \left[\frac{f_{out} \cdot 2^{28}}{M_T \cdot f_c}\right] \cdot M_T$$

$$f_{out}' = \frac{M \cdot f_c}{2^{28}}$$

where:
brackets [ ] indicate rounding to the nearest integer;
$M_T$ sets the DDS to output a frequency that converges in a period close to, but slightly different from $f_T$, again due to rounding.

This in turn results in a new sampling window T':

$$T' = \frac{2^{28}}{M_T \cdot f_c} \approx \frac{1}{240.01}[s] \qquad \text{(Equation 7)}$$

Now the values of M are integers, so the DDS can output the modified frequencies perfectly. The values of M are also multiples of $M_T$, and thus correspond to frequencies that are orthogonal in the new sampling window T' and converge every T'. The new frequencies are:

$$f_{out}' \approx [24000.55\ 25920.59\ 27840.64]\ Hz$$

With these new frequencies, the phase relationship can be determined as described above.

The above discussion assumes that there is no phase shift between the three frequencies generated by the DDS components, and that they start exactly together and converge again approximately every 1/240 of a second. While this is true for the raw signals generated by the DDS components, as above the transmitted frequencies and the frequencies sampled by the receiver may suffer some phase shift induced by the analog circuitry. For example, filters in the transmitter or receiver are known to often have frequency dependent phase shift behavior. Thus, to obtain a stable solution, it is desirable to compensate for the analog phase shifts in the complex Sigmat before running the process described above.

To do this, for each band the analog phase shift calibration is represented by a 3×3 angle matrix $P_{mn}$, which is applied to the complex Sigmat $Z_{mn}$ in a component-wise multiplication:

$$\exp(iP_{mn}) \cdot (Z_{mn}) \qquad \text{(Equation 8)}$$

This shifts each component of the complex Sigmat by the corresponding angle from the analog phase calibration matrix, thus removing any undesired analog phase shift from the computed Sigmat.

The phase calibration matrix describes analog phase shifts induced by the receiver and transmitter combined, but can also be broken into two separate calibration matrices, one for the receiver and the other for the transmitter, if desired. It can be predicted by simulation or computed directly for a specific receiver/transmitter combination.

One possible way for computing the phase calibration matrix is by injecting a signal of known phase and measuring its output on the other end. For example, for the receiver, very accurate signals of known phase can be injected, and then the output of the receiver's ADC can be analyzed to calibrate the receiver. For the transmitter, signals of known phase can be outputted from the DDS components, and then measured on the transmitting coils by a phase-calibrated receiver; the transmitter is calibrated when perfectly explained signals are found on the phase-calibrated receiver's ADC. Comparing the phase between initial signal and output signal gives the transmitter phase shift for the specific frequency.

In another embodiment, the phase calibration matrix can be determined by measuring complex Sigmats collected in a standard receiver/transmitter operation, preferably with perfectly synced Sigmats, for example, in a calibration process. The angle shift calibration matrix $P_{mn}$ is then found by means of optimization; each possible angle shift calibration matrix $P_{mn}$ is given a score depending on the performance of the synchronization algorithm after applying the calibration, as the synchronization will perform well (in terms of confidence level) only for well-calibrated data. Averaging on many measurements, synchronization will perform well only when angle shift calibration matrix $P_{mn}$ reflects the actual analog phase calibration matrix. Using synchronization as a score metric, angle shift calibration matrix $P_{mn}$ is searched by means of global and/or local optimization until the synchronization returns the best results. This calibration is done a single time during the production of the unit.

There is also a way to perform phase-shift calibration automatically a single time the system is powered on. The calibration can be computed on-the-fly, then saved in a non-volatile RAM for later use, as if it was factory calibrated, in a fashion similar to how magnetometers are online calibrated for their unknown biases. The calibration process mentioned above is able to run on online collected complex Sigmats. The phase calibration does not need to be supervised and can find the analog phase shifts using any kind of complex Sigmat measurements.

When the system is not yet calibrated it may collect complex Sigmat measurements until it has enough distribution to run an unsupervised phase calibration process as mentioned above. If the calibration process succeeds, a phase calibration matrix is produced which may be used in conjunction with future Sigmats to automatically find the phase in the synchronization algorithm. If for some reason the synchronization fails to perform, the system will be able to detect the fault and recalibrate; otherwise the calibration matrix will remain saved in the device's RAM to be applied to the complex Sigmat computed by the DFT in future uses without further calibration. Calibration confidence and scores may easily be produced as part of the online phase calibration process. Acceptance criteria may be constructed to qualify or disqualify online calibration results.

After solving for synchronization, tracking of the synchronization can then be performed based on traditional Sigmat-to-Sigmat value comparison, or by tracking the actual phase, the $\varphi$ parameter above. In an ideal system $\varphi$ would be constant over time and would just reflect the constant receiver to transmitter clock shift, but in a realistic system the receiver and transmitter, operated by different clock oscillator crystals, slightly drift over time.

Assuming that $\varphi$ only drifts slowly, it can be tracked over consecutive frames, stabilized by full runs of the synchronization algorithm in a simple fusion algorithm. Over reliable frames $\varphi$ can be computed directly by running the full synchronization algorithm. During unreliable frames, for example when electromagnetic distortion is present, $\varphi$ can be estimated from previous frames by tracking the slow receiver to transmitter clock drift.

In addition, synchronization can be used for electromagnetic distortion detection. Assuming that electromagnetic distortion is correlated with phase distortion to some extent, in cases of electromagnetic distortion, it will be more difficult for synchronization to find a near real-valued solution for the Sigmat that minimizes the sync equations as above. There will always be some off-phase remainder due to the electromagnetic distortion, expressed as the imaginary part of the final corrected Sigmat. The percentage of the remaining imaginary part in the final corrected Sigmat reflects the amount of electromagnetic distortion and can be used for distortion detection and correction.

For example, when no distortion is present, synchronization is able to rotate the complex Sigmat such that the final Sigmat is almost completely real valued, with an imaginary part that constitutes less than 1% of the total norm, or absolute value. When distortion is present some phase error is introduced, depending on the nature of the distortion, but the phase is almost always distorted to some extent. In this case the imaginary part of the final Sigmat may constitute more than 5% of the total norm. The percentage of unexplained phase, which is the norm of the imaginary part of the final corrected Sigmat, divided by the total norm of the final corrected Sigmat, can therefore be used for distortion detection.

The receiver may run synchronization continuously and output the percentage of unexplained phase as an additional output to the processor. The processor may then use this parameter as additional input to a distortion correction algorithm, to detect distortion not only based on errors in the Sigmat and fusion of any IMU readings, but also based on phase; for example, the processor may put the percentage of unexplained phase through some threshold or sigmoid curve to represent the probability of a Sigmat to be distorted.

Additionally, phase information can be used not only for distortion detection, but also for distortion correction. As long as synchronization tracks the true phase of the system, it may be assumed that the imaginary part of the corrected Sigmat always corresponds to distortion, and thus can be ignored. Then, instead of taking the amplitudes of the complex Sigmat, only its real part may be taken after synchronization, dismissing the remaining imaginary part that is believed to be due to distortion. The final real-valued Sigmat may then be less affected by distortion.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above. It will also be apparent that in some instances the order of steps described herein may be altered without changing the result of performance of all of the described steps.

There may be a single processor, or multiple processors performing different functions of the functions described herein. One of skill in the art will appreciate how to determine which and how many processors will be appropriate for a specific intended application, and where in a given system they might be located. In some embodiments a single processor may perform all of the processing functions described herein; in other embodiments, the receiver may contain a separate processor to compute the SigMat from the sensor data.

It should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A system for synchronizing a transmitter and a receiver in a magnetic tracking system, comprising:
   the transmitter having a plurality of source magnetic coils configured to generate a magnetic field at orthogonal frequencies that converge over a sampling window, each frequency provided by a direct digital synthesis (DDS) component;

the receiver having a plurality of sensor magnetic coils configured to sense the magnetic field and generate magnetic sensor data; and a processor configured to:
perform a complex discrete Fourier transform on the magnetic sensor data from the sensor magnetic coils to determine a complex signal matrix (Sigmat) representing the phase of the sensed magnetic field frequencies;
rotate the complex Sigmat by rotating the phases of the sensed magnetic field frequencies to seek convergence of the complex Sigmat at a nearly real value;
compute as an error for each rotation a norm of any remaining imaginary portion of the rotated Sigmat;
multiply the rotated Sigmat by −1 when the real-valued determinant of the rotated Sigmat with the smallest computed error is negative;
compute a confidence value by dividing a second smallest computed error by the smallest computed error;
determine that the confidence value is over a predetermined threshold; and
use the real part of the rotated Sigmat with the smallest computed error to synchronize the receiver with the transmitter.

2. The system of claim 1 wherein the processor is configured to rotate the sensed magnetic field frequencies by aligning the complex Sigmat such that the major frequency element becomes real valued and rotating the other two frequencies.

3. The system of claim 1 wherein the transmitter and receiver are calibrated to determine a phase shift in the magnetic field frequencies due to any analog components therein, and the processor is further configured to rotate the sensed magnetic field frequencies by an equal amount to counter the phase shift due to the analog components.

4. The system of claim 1 wherein the processor is further configured to determine a level of distortion in the magnetic field by dividing a norm of an imaginary portion of the rotated Sigmat with the smallest computed error by a norm of the rotated Sigmat with the smallest computed error.

5. The system of claim 1 wherein the magnetic tracking system is a wired magnetic tracking system.

6. The system of claim 1 wherein the magnetic tracking system is a wireless magnetic tracking system.

7. A method of synchronizing a transmitter and a receiver in a magnetic tracking system, comprising:
generating a magnetic field from a plurality of source magnetic coils in the transmitter, the source coils configured to generate a magnetic field at orthogonal frequencies that converge over a sampling window, each frequency provided by a direct digital synthesis (DDS) component;
generating magnetic sensor data by sensing the magnetic field using a plurality of sensor magnetic coils in the receiver;
performing by a processor a complex discrete Fourier transform on the magnetic sensor data from the sensor magnetic coils to determine a complex signal matrix (Sigmat) representing the phase of the sensed magnetic field frequencies;
rotating by the processor the complex Sigmat by rotating the phases of the sensed magnetic field frequencies to seek convergence of the complex Sigmat at a nearly real value;
computing by the processor as an error for each rotation a norm of any remaining imaginary portion of the rotated Sigmat;
multiplying by the processor the rotated Sigmat by −1 when the real-valued determinant of the rotated Sigmat with the smallest computed error is negative;
computing by the processor a confidence value by dividing a second smallest computed error by the smallest computed error;
determining by the processor that the confidence value is over a predetermined threshold; and
using by the processor the real part of the rotated Sigmat with the smallest computed error to synchronize the receiver with the transmitter.

8. The method of claim 7 wherein rotating by the processor the sensed magnetic field frequencies comprises aligning the complex Sigmat such that the major frequency element becomes real valued and rotating the other two frequencies.

9. The method of claim 7 wherein the transmitter and receiver are calibrated to determine a phase shift in the magnetic field frequencies due to any analog components therein, and further comprising rotating the sensed magnetic field frequencies by an equal amount to counter the phase shift due to the analog components.

10. The method of claim 7 further comprising determining a level of distortion in the magnetic field by dividing a norm of an imaginary portion of the rotated Sigmat with the smallest computed error by a norm of the rotated Sigmat with the smallest computed error.

11. The method of claim 7 wherein the magnetic tracking system is a wired magnetic tracking system.

12. The method of claim 7 wherein the magnetic tracking system is a wireless magnetic tracking system.

13. A non-transitory computer readable storage medium having embodied thereon instructions for causing a computing device to execute a method for synchronizing a transmitter and a receiver in a magnetic tracking system, the method comprising:
generating a magnetic field from a plurality of source magnetic coils in the transmitter, the source coils configured to generate a magnetic field at orthogonal frequencies that converge over a sampling window, each frequency provided by a direct digital synthesis (DDS) component;
generating magnetic sensor data by sensing the magnetic field using a plurality of sensor magnetic coils in the receiver;
performing by a processor a complex discrete Fourier transform on the magnetic sensor data from the sensor magnetic coils to determine a complex signal matrix (Sigmat) representing the phase of the sensed magnetic field frequencies;
rotating by the processor the complex Sigmat by rotating the phases of the sensed magnetic field frequencies to seek convergence of the complex Sigmat at a nearly real value;
computing by the processor as an error for each rotation a norm of any remaining imaginary portion of the rotated Sigmat;
multiplying by the processor the rotated Sigmat by −1 when the real-valued determinant of the rotated Sigmat with the smallest computed error is negative;
computing by the processor a confidence value by dividing a second smallest computed error by the smallest computed error;

determining by the processor that the confidence value is over a predetermined threshold; and
using by the processor the real part of the rotated Sigmat with the smallest computed error to synchronize the receiver with the transmitter.

14. A system for synchronizing a transmitter and a receiver in a magnetic tracking system, comprising:
the transmitter having a plurality of source magnetic coils configured to generate a magnetic field at orthogonal frequencies that converge over a sampling window, each frequency provided by a direct digital synthesis (DDS) component;
the receiver having a plurality of sensor magnetic coils configured to sense the magnetic field and generate magnetic sensor data; and
a processor configured to:
  perform a complex discrete Fourier transform on the magnetic sensor data from the sensor magnetic coils to determine a complex signal matrix (Sigmat) representing the phase of the sensed magnetic field frequencies;
  change values of a middle column of the complex Sigmat to zero, creating a first modified Sigmat;
  rotate the modified Sigmat by rotating the phases of the sensed magnetic field frequencies to seek convergence of the modified Sigmat at a nearly real value, thereby obtaining a first phase adjustment;
  rotate the modified Sigmat by the first phase adjustment and restore the values of the middle column, creating a second modified Sigmat;
  rotate the second modified Sigmat by a second phase adjustment within a range determined from values of first and third columns of the rotated Sigmat;
  compute as an error for each rotation of the second modified Sigmat a norm of any remaining imaginary portion of the second modified Sigmat;
  multiply the second modified Sigmat by −1 when the real-valued determinant of the rotated second modified Sigmat with the smallest computed error is negative;
  compute a confidence value by dividing a second smallest computed error by the smallest computed error;
  determine that the confidence value is over a predetermined threshold; and
  use the real part of the rotated second modified Sigmat with the smallest computed error to synchronize the receiver with the transmitter.

15. A method of synchronizing a transmitter and a receiver in a magnetic tracking system, comprising:
generating a magnetic field from a plurality of source magnetic coils in the transmitter, the source coils configured to generate a magnetic field at orthogonal frequencies that converge over a sampling window, each frequency provided by a direct digital synthesis (DDS) component;
generating magnetic sensor data by sensing the magnetic field using a plurality of sensor magnetic coils in the receiver;
performing by a processor a complex discrete Fourier transform on the magnetic sensor data from the sensor magnetic coils to determine a complex signal matrix (Sigmat) representing the phase of the sensed magnetic field frequencies;
changing by the processor values of a middle column of the complex Sigmat to zero, creating a first modified Sigmat;
rotating by the processor the modified Sigmat by rotating the phases of the sensed magnetic field frequencies to seek convergence of the modified Sigmat at a nearly real value, thereby obtaining a first phase adjustment;
rotating by the processor the modified Sigmat by the first phase adjustment and restore the values of the middle column, creating a second modified Sigmat;
rotating by the processor the second modified Sigmat by a second phase adjustment within a range determined from values of first and third columns of the rotated Sigmat;
computing by the processor as an error for each rotation of the second modified Sigmat a norm of any remaining imaginary portion of the second modified Sigmat;
multiplying by the processor the second modified Sigmat by −1 when the real-valued determinant of the rotated second modified Sigmat with the smallest computed error is negative;
computing by the processor a confidence value by dividing a second smallest computed error by the smallest computed error;
determining by the processor that the confidence value is over a predetermined threshold; and
using by the processor the real part of the rotated second modified Sigmat with the smallest computed error to synchronize the receiver with the transmitter.

16. A non-transitory computer readable storage medium having embodied thereon instructions for causing a computing device to execute a method for synchronizing a transmitter and a receiver in a magnetic tracking system, the method comprising:
generating a magnetic field from a plurality of source magnetic coils in the transmitter, the source coils configured to generate a magnetic field at orthogonal frequencies that converge over a sampling window, each frequency provided by a direct digital synthesis (DDS) component;
generating magnetic sensor data by sensing the magnetic field using a plurality of sensor magnetic coils in the receiver;
performing by a processor a complex discrete Fourier transform on the magnetic sensor data from the sensor magnetic coils to determine a complex signal matrix (Sigmat) representing the phase of the sensed magnetic field frequencies;
changing by the processor values of a middle column of the complex Sigmat to zero, creating a first modified Sigmat;
rotating by the processor the modified Sigmat by rotating the phases of the sensed magnetic field frequencies to seek convergence of the modified Sigmat at a nearly real value, thereby obtaining a first phase adjustment;
rotating by the processor the modified Sigmat by the first phase adjustment and restore the values of the middle column, creating a second modified Sigmat;
rotating by the processor the second modified Sigmat by a second phase adjustment within a range determined from values of first and third columns of the rotated Sigmat;
computing by the processor as an error for each rotation of the second modified Sigmat a norm of any remaining imaginary portion of the second modified Sigmat;
multiplying by the processor the second modified Sigmat by −1 when the real-valued determinant of the rotated second modified Sigmat with the smallest computed error is negative;

computing by the processor a confidence value by dividing a second smallest computed error by the smallest computed error;
determining by the processor that the confidence value is over a predetermined threshold; and
using by the processor the real part of the rotated second modified Sigmat with the smallest computed error to synchronize the receiver with the transmitter.

\* \* \* \* \*